United States Patent

Kennicutt et al.

[11] Patent Number: 4,969,552
[45] Date of Patent: Nov. 13, 1990

[54] METHOD AND APPARATUS FOR INVERTING PRINTED CIRCUIT BOARDS

[75] Inventors: Robert C. Kennicutt, Port Crane; Michael J. Oswald, Kirkwood, both of N.Y.

[73] Assignee: Universal Instruments Corporation, Binghamton, N.Y.

[21] Appl. No.: 356,864

[22] Filed: May 25, 1989

[51] Int. Cl.⁵ .............................................. B65G 47/24
[52] U.S. Cl. .................................... 198/399; 198/403; 198/411
[58] Field of Search .................... 198/403, 399, 411; 414/758, 759, 762, 771, 772, 777, 778, 779, 764, 766, 782

[56] References Cited

U.S. PATENT DOCUMENTS

| | | | |
|---|---|---|---|
| 3,247,963 | 4/1966 | Fehely | 198/403 X |
| 3,347,349 | 10/1967 | Carlson | 198/403 X |
| 3,948,385 | 4/1976 | Shinomiya | 198/403 |
| 4,095,700 | 6/1978 | Chiuaru et al. | 198/403 X |
| 4,213,380 | 7/1980 | Kahn | 198/403 X |
| 4,214,655 | 7/1980 | Bernham et al. | 198/403 X |
| 4,457,662 | 7/1984 | Ireland et al. | 198/403 X |
| 4,523,670 | 6/1985 | Yanagisawa et al. | 198/403 |
| 4,533,291 | 8/1985 | Nishida | 198/403 X |

FOREIGN PATENT DOCUMENTS 3222058 12/1983 Fed. Rep. of Germany ...... 198/403

Primary Examiner—H. Grant Skaggs
Assistant Examiner—D. Glenn Dayoan
Attorney, Agent, or Firm—Fidelman and Wolffe

[57] ABSTRACT

The device flips substrates or passes them through without flipping, selectively, and the substrate can enter either end and exit either end of the device, as desired depending on how it is assembled. The spacing between channels which restrain opposite edges of the substrate is adjustable so as to accommodate different widths. The channels are separate from, but cooperable with, feed wheels which extend into the channels and engage the board when the channels are not moved out of alignment with the feed plane, e.g., when the flipping action is not taking place. During flipping, one end of each channel is raised above the feed plane, while the other end is moved substantially parallel to the feed plane so as to eliminate interference with an undercarriage or anything else below the feed plane of the device.

8 Claims, 8 Drawing Sheets

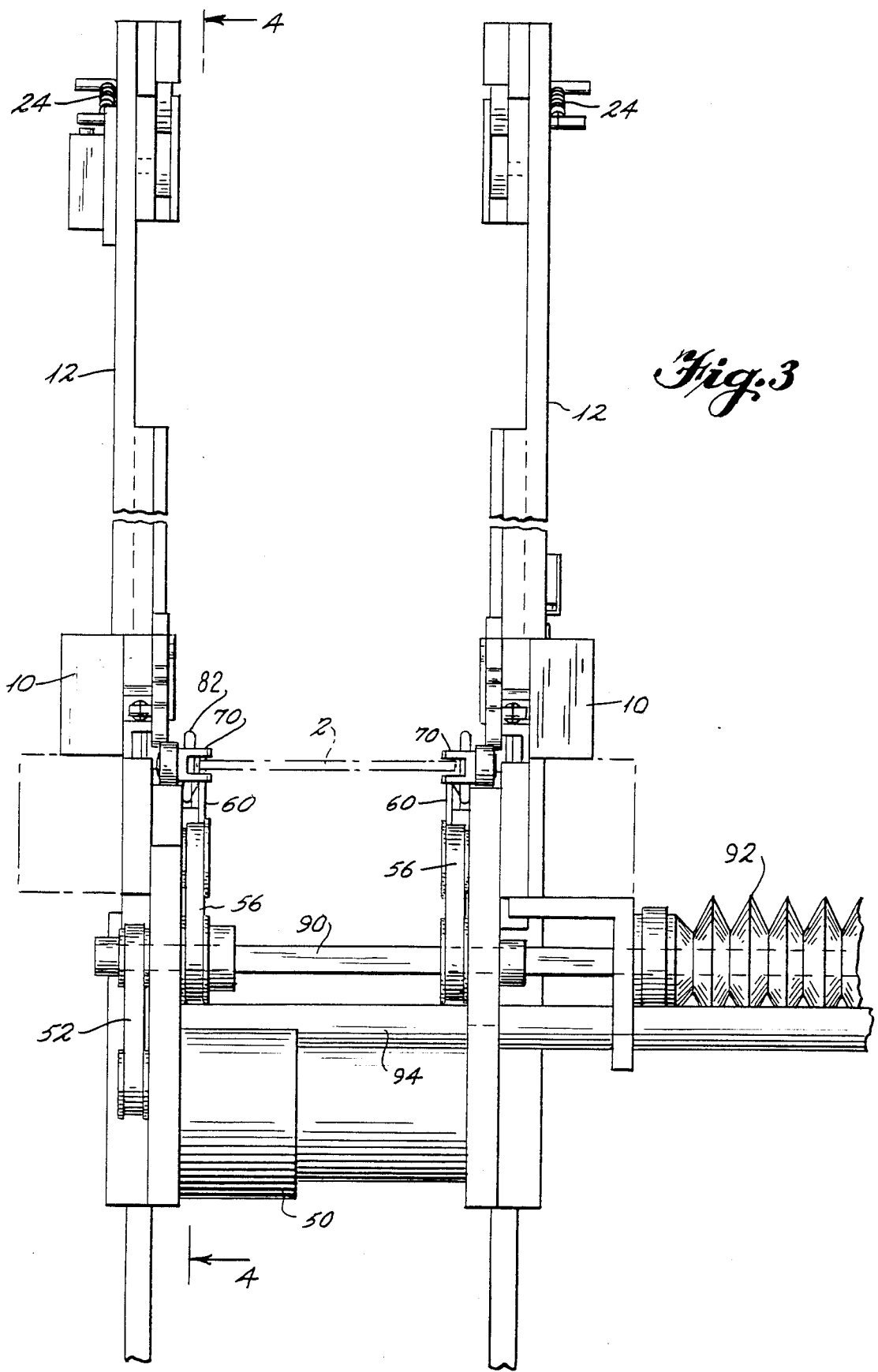

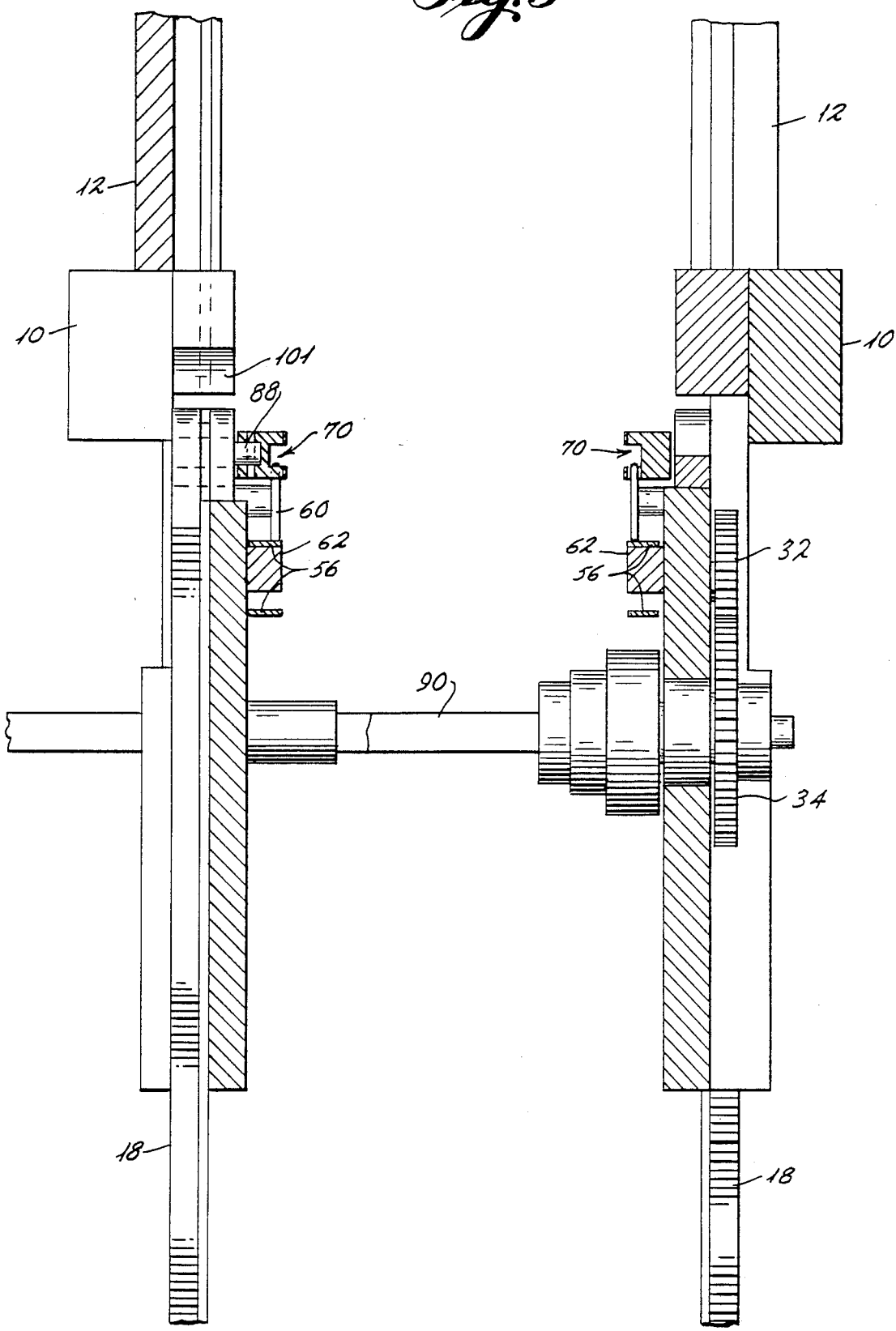

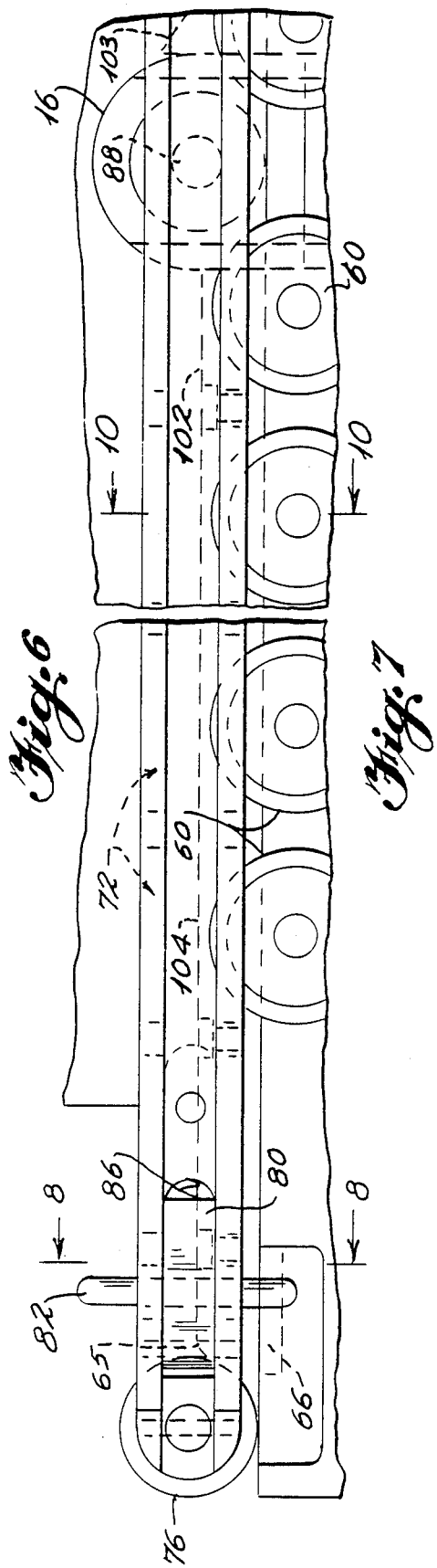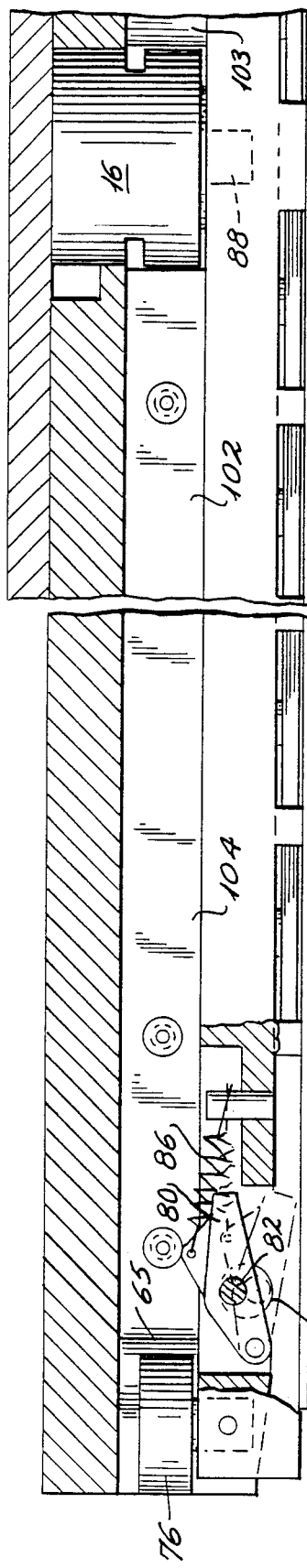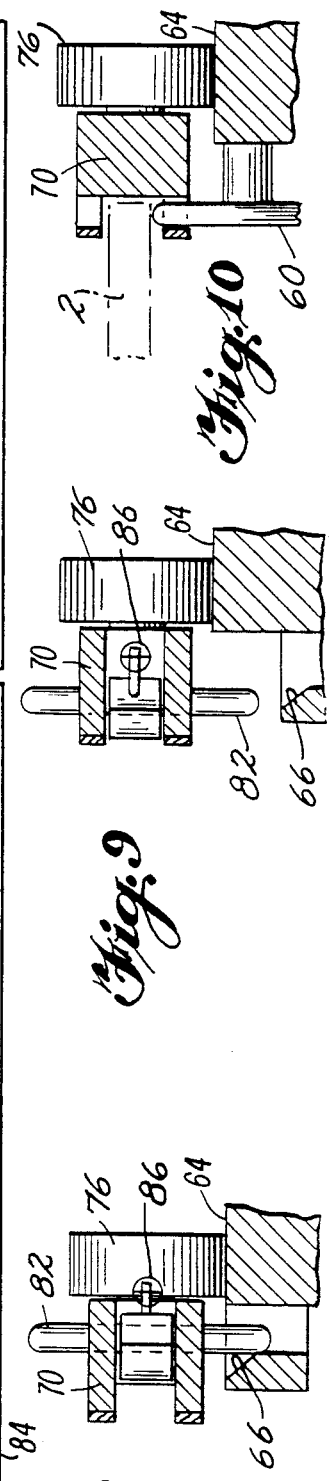

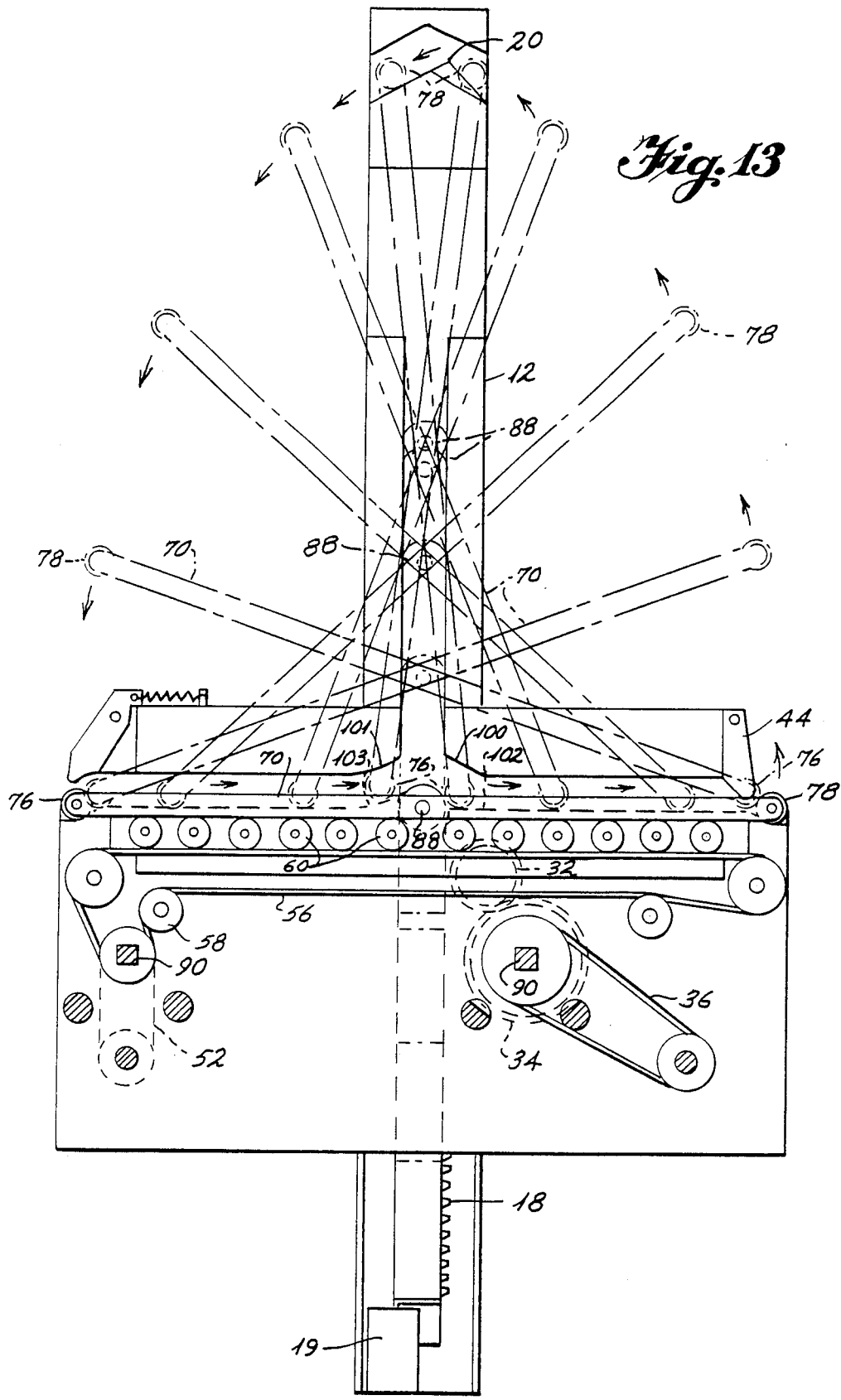

METHOD AND APPARATUS FOR INVERTING PRINTED CIRCUIT BOARDS

FIELD OF THE INVENTION

The field of the invention generally deals with substrate handling, such as selective manipulation of printed circuit boards during automated transfer of the boards between various work stations such as component mounting and soldering stations. The invention is applicable to handling individual circuit boards or sheets of multiple boards prior to separation of each sheet into individual boards. For that matter, the inventive concept is applicable to any industry involving manipulation of a substrate.

BACKGROUND OF THE INVENTION

In the industry involving high speed automated handling of printed circuit board substrates, the boards typically are moved from station to station for step-wise performance of functions such as mounting components on opposite sides of the board, testing the components, wave soldering, reflow soldering, and the like. Sometimes, it is required to flip the substrate so as to operate on the top surface thereof at one station and on the bottom surface thereof at the next station.

Heretofore, a device has been provided for receiving and flipping printed circuit boards and, alternatively, transporting the boards through the device without flipping them. During such flipping, the board retaining mechanism of this device passes below a feed plane, generally defined as the plane of the board prior to flipping, so as to require greater undercarriage clearance and thus limit the length of the board according to that clearance. Further, the prior art device requires recycling thereof after flipping a board in order to position the same end of the flipping mechanism for receiving the next board to be handled.

Thus, it is an objective of the invention to flip or not flip a printed circuit board, selectively and under command of a programmable computer or other form of controller, so as to present the appropriate surface of the board for work at a work station, while keeping the board substantially on one side of the feed plane during such flipping.

Additionally, it is an objective of the invention to provide for flipping boards which are lesser or greater in length than the edge restraining channels of the device, without interference with any undercarriage of the device.

Further, it is an objective of the invention to provide for easy adjustment of spacing between the board restraining channels so as to accommodate boards of different widths.

Still further, it is an objective of the invention to provide that the device does not require recycling in order to receive the next substrate to be handled.

Moreover, it is an objective of the invention to provide that the substrates may enter either end and exit either end of the device, as desired, with revision of a few parts in assembly of the device.

BRIEF SUMMARY OF THE INVENTION

The device flips substrates or passes them through without flipping, selectively, and the substrate can enter either end and exit either end of the device, depending on how it is assembled. The spacing between channels which restrain opposite edges of the substrate is adjustable so as to accommodate different widths. The channels are separate from, but cooperable with, feed wheels which extend into the channels and engage the board when the channels are not moved out of alignment with the feed plane, e.g., when the flipping action is not taking place. During flipping, one end of each channel is raised above the feed plane, while the other end is moved substantially parallel to the feed plane so as to eliminate interference with an undercarriage or anything else below the feed plane of the device.

BRIEF DESCRIPTION OF THE DRAWINGS

FIG. 3 is an end elevation of the device as viewed along the feed plane of a printed circuit board.
FIG. 5 is an enlarged, fragmentary cross section of FIG. 2 as viewed generally in the direction of arrows 5—5 thereof.
FIG. 6 is an enlarged, fragmentary of the device of FIG. 4.
FIG. 7 is a top plan view of FIG. 6.
FIG. 8 is a cross section of FIG. 6 as viewed generally in the direction of arrows 8—8 of FIG. 6, with the channel blocker open.
FIG. 9 is a cross section illustrating a follower wheel of the channel on a raised portion of the horizontal guide way, just prior to reaching the position of FIG. 8, so as to illustrate the blocker being closed.
FIG. 10 is a cross section as viewed generally in the direction of arrows 10—10 of FIG. 6 so as to illustrate a feed wheel extending through a gap in the channel and engaging a printed circuit board.
FIG. 13 shows the device assembled for flipping boards in the opposite direction of FIG. 12.

DETAILED DESCRIPTION OF THE INVENTION

Figure 2:
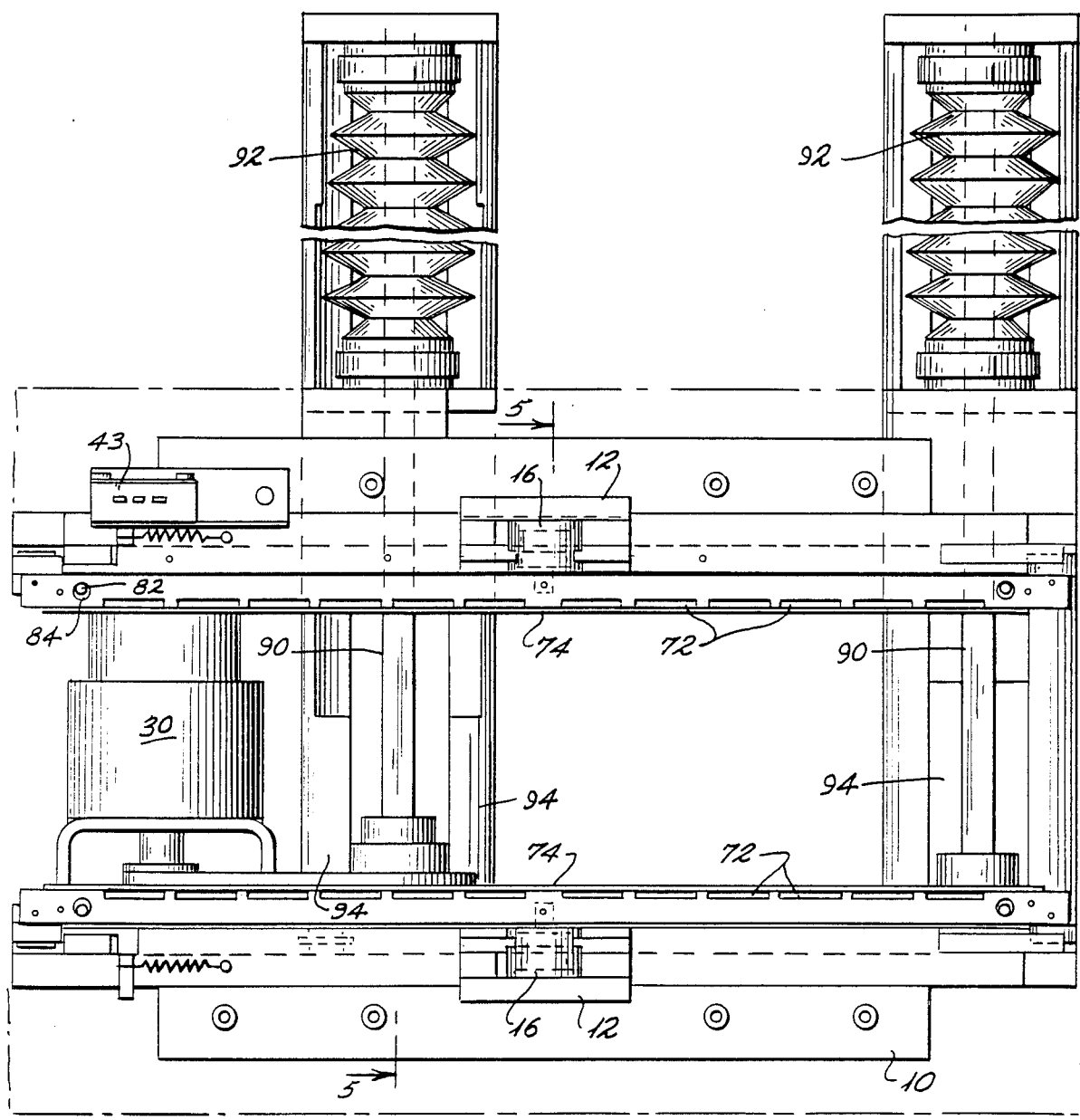
FIG. 2 is a top plan view of FIG. 1.
Figure 11:
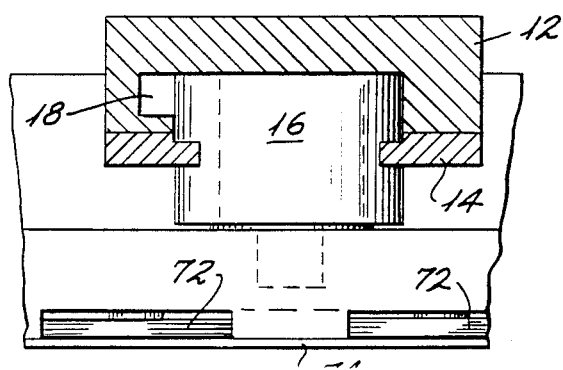
FIG. 11 is an enlarged fragmentary cross section as viewed generally in the direction of arrows 11—11 of FIG. 1.

Flipping of a circuit board is accomplished by flipping or inverting two channels 70 which are spaced apart sufficiently to receive opposite edges of the substrate or circuit board. As seen in FIGS. 5 and 8-10, these channels are generally U-shaped in cross section. Referring to FIGS. 2 and 11, it may be seen that sides gaps are milled in both side of the "U" of each channel so that the outer periphery of each drive wheel 60 (FIG. 10) can protrude through either side of the "U" and into the corresponding gap 72 to engage the edge of the circuit board 2 for frictional feed thereof. Steel strips 74 are attached to, but could be integral with, each channel 70 in order to close each gap 72 and thus keep the front end of a warped printed circuit board from getting caught on a gap when feeding or driving the circuit board into or out of a respective channel 70.

Opposite ends of each channel 70 have follower wheels 76, 78 so that either end of the channels may follow a horizontal guide 64 FIGS. 1 and 8-10 during inversion of the channel 70. Each channel also has a channel blocker 80 pivotally attached at each end of the channel, with the free end of the blocker being spring biased to a "blocking position" so as to prevent egress of a circuit board from the channel 70 unless the blocker 80 is held open against the bias of tension spring 86.

As best seen in FIGS. 6–10, each channel blocker 80 has pins 82 protruding therefrom and extending through corresponding slots or oversized holes 84 in a channel 70. These pins 82 are adapted to cooperate with camming surface 66 (FIGS. 8 and 9) so as to move the channel blocker 80 from the phantom line position of FIG. 7 to the solid line position thereof against the bias of the corresponding spring 86.

Referring to FIGS. 1–5 and 11, each channel 70 has a central pivot point 88 at which it is pivotally connected to a slide 16 which moves up and down in vertical guide 14 of a vertical bar 12 which, in turn, is mounted on horizontal mounting block 10. Integral with slide 16 is a rack 18 (FIGS. 1,4, and 11); and a pinion 32 meshes with rack 18 and a spur gear 34 which is rotated by reversible motor 30 via timing belt 36. A switch 19 detects when rack 18 is in the "down" position.

Reversible motor 50 drives frictional drive belt 56 via timing belt 52, gear arrangement 54, and belt tensioner 58. Frictional drive belt 56, in turn, frictionally engages the outer periphery of feed wheels 60. A back-up platen 62 is situated on the opposite side of drive belt 56 from the feed wheels 60; and an arcuate relief 63 is provided in the back-up 62 opposite of each feed wheel so as to allow a greater tolerance in the outer diameters of the feed wheels 60.

Figure 1:
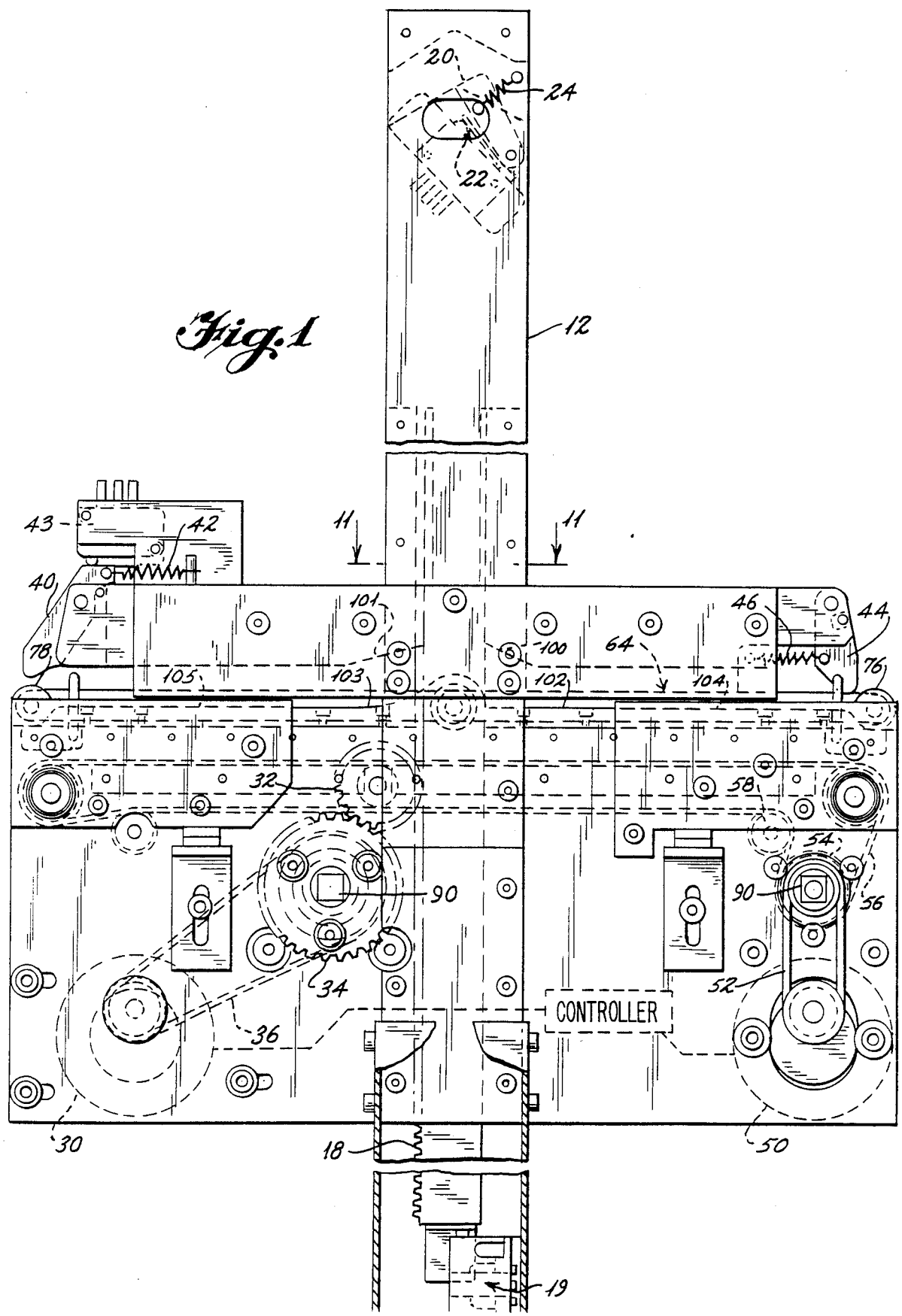
FIG. 1 is a left side elevation of the device of FIG. 3.

Baffles 40 and 44 are provided at opposite ends of the horizontal mounting block 10 for the purpose of controlling the direction in which a channel 70 can flip during raising and lowering of rack 18. Baffle 40 is spring biased to the position of FIG. 4 by tension spring 42, and baffle 44 is spring biased to the position of FIG. 4 by spring 46. As seen in FIG. 1, movement of baffle 40 is sensed by a switch 43.

Figure 12:
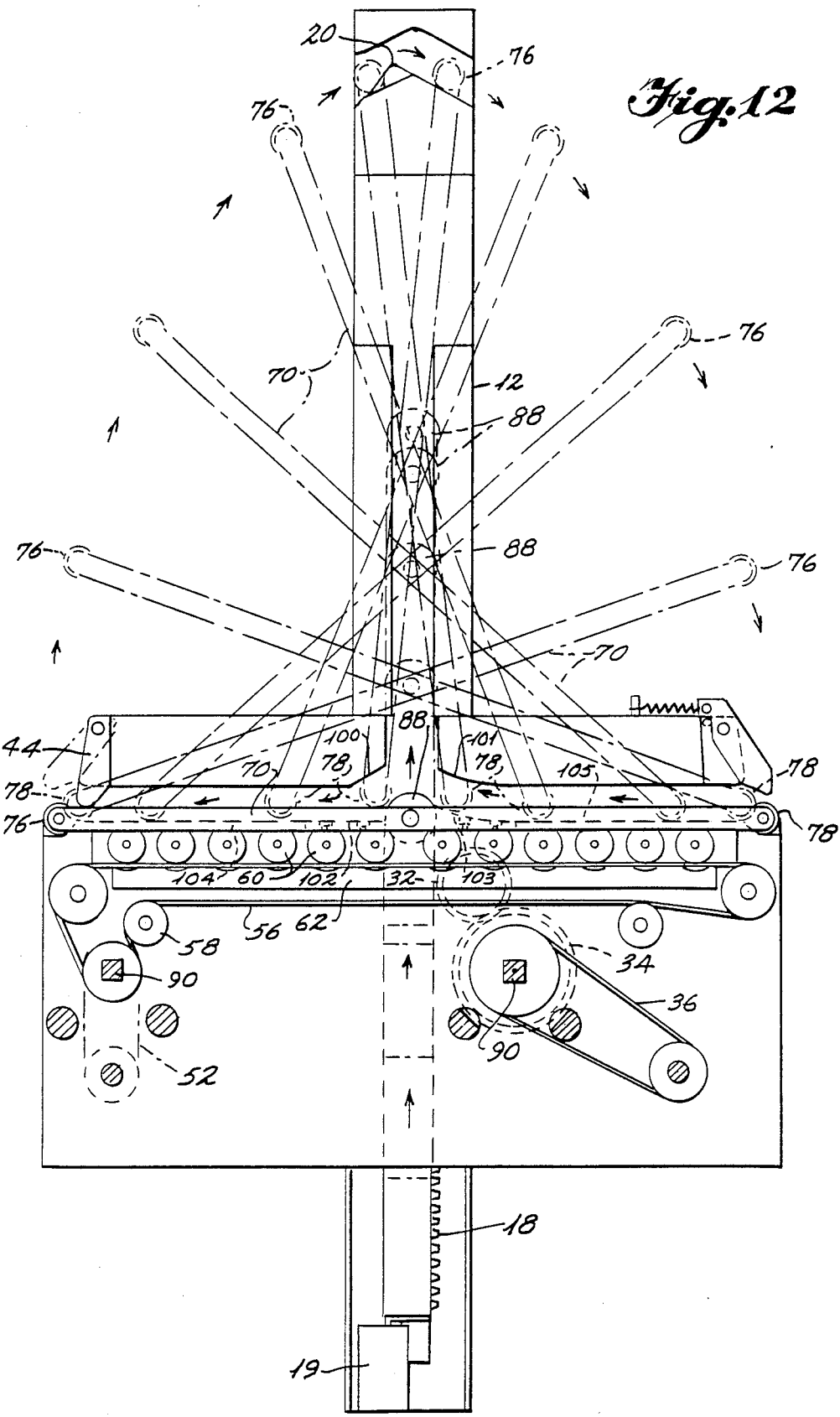
FIG. 12 is a view similar to FIG. 4 and illustrates various positions of an edge restraining channel during flipping of a printed circuit board.

FIG. 12 shows the orientation of parts when used in a right to left board travel configuration. FIG. 13 shows it when the board travel is left to right. Baffles 40, 44 and 20 along with their holding blocks and switches would be reversed. Also cams 100, 101, 102, 103, 104 and 105 would be reversed.

OPERATION OF THE DEVICE DURING FLIPPING

Referring to the Figures, particularly FIG. 12, a circuit board 2 is fed or inserted sufficiently into the device such that at least one drive wheel 60 engages it at each edge (as illustrated in FIG. 10) so that the circuit board side edges can be driven by wheels 60 into the corresponding channels 70 until the leading edge of the circuit board interrupts a laser beam switch or the like (not shown) to provide an indication that the circuit board is within the channel sufficiently for flipping thereof. When the channels are located in the position of FIG. 4, pins 82 engage camming surfaces 66 and move channel blockers 80 to the position of FIG. 8 so that the channels 70 are open for reception of the circuit board. Having driven a circuit board sufficiently into the channels 70, the leading edge is sensed and the information is transmitted to a controller which, in turn, controls halting of feed motor 50 and commencement of motor 30 in one direction so as to raise rack 18 and the center pivot 88 of each channel 70. When raising the center of a channel 70, baffle 44 allows one end 76 of the channel 70 to be raised (FIG. 12) while baffle 40 ensures that the follower wheel 78 at the opposite end of the channel follows horizontal guide 64. At or near the upper limit of raising rack 18, follower wheel 76 of channel 70 will depress and pass over top baffle 20 against the bias of spring 24 so as to ensure inversion of the channel 70 with downward movement of rack 18 during reversing of motor 30. Switch 22 (FIG. 1) is actuated when follower 76 depresses top baffle 20 against the bias of spring 24, so that a controller will know when to reverse the rack driving motor 30.

Figure 4:
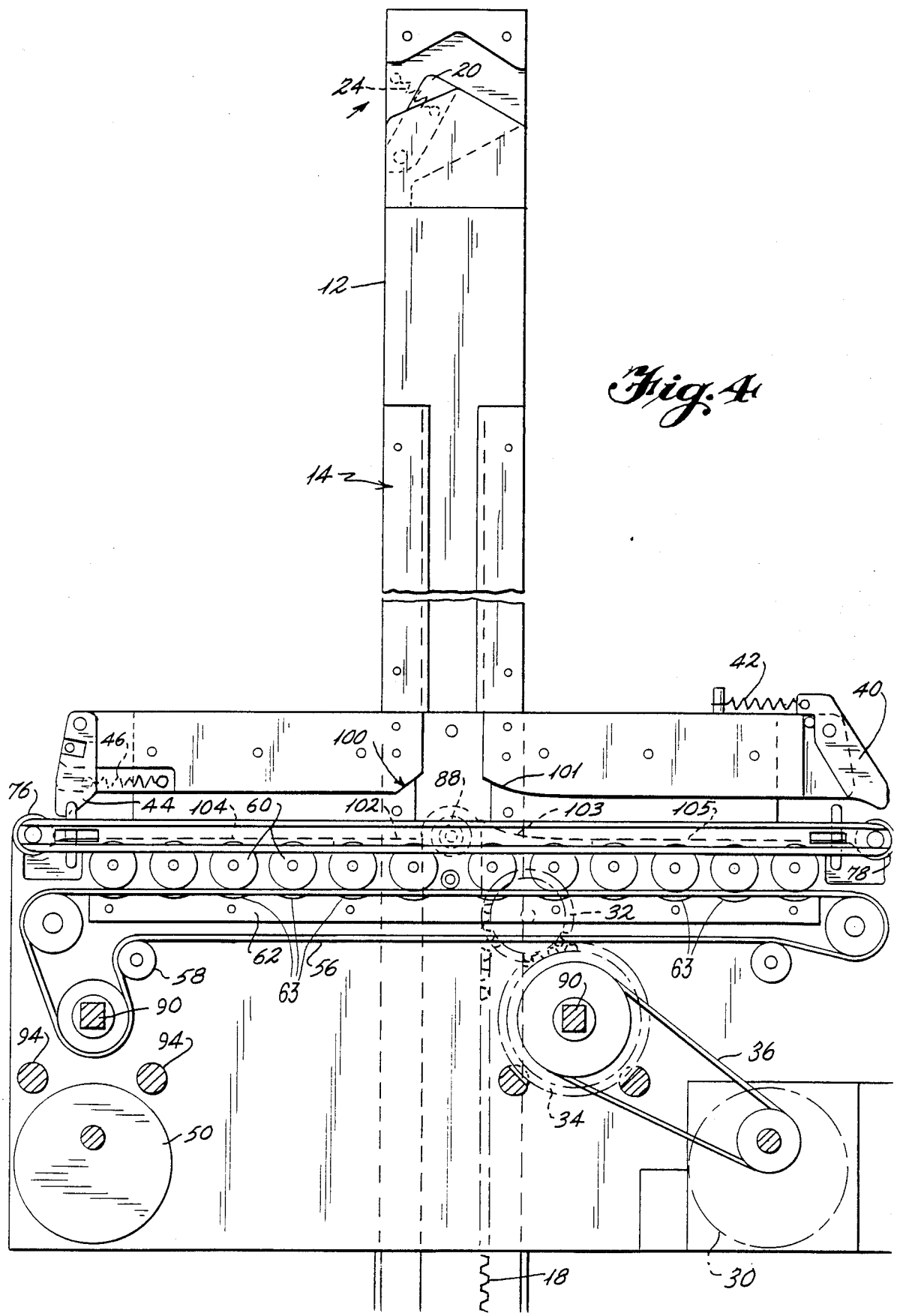
FIG. 4 is a cross sectional view, generally in the direction of arrows 4—4 of FIG. 3.

Once the inversion of channel 70 has been completed from the orientation illustrated in FIG. 4 to one in which the ends of channel 70 are opposite that illustrated in FIG. 4, the pins 82 of channel blockers 80 will have engaged camming surface 66 so as to allow the circuit board to be fed out of the channel by actuation of feed motor 50. Feed motor 50 may be driven in either direction so that the boards may be loaded into the channels from either end and may be unloaded from the channels out of either end thereof. FIG. 9 illustrates the position follower 78 in one of the intermediate positions of FIG. 12 such that the follower is riding on a raised portion of horizontal guide 64 prior to the dropoff 65 (FIG. 6) of horizontal guide 64.

As may be seen from the drawings, each side of the board inverter is substantially a mirror image of the other side, with the left side as viewed in FIG. 3, having support rods 94 affixed thereto and the right side of the device being moveable toward and away from the left side on support rods 94. Such an arrangement allows for adjusting the device to substrates or circuit boards of various widths. Square drive rods 90 insure channel inversion on both sides of the device according to whatever spacing is provided between the sides, and bellows members 92 cover the outer ends of square rods 90 and accommodate these widths adjustments.

As may be appreciated by reference to the drawings, the edge restraining channels are cooperable with but separate from the frictional feed wheels 60 providing for simplicity and minimizing the weight of that portion of the device which actually inverts with the circuit board. The simple, yet elegant, design of the device also allows substrate entrance into the device from either direction and exit of the substrate out of the device in either direction, selectively. It is also to be noted that the orientation of the overall device does not matter in order to invert or flip a substrate, as long as the length of the substrate is wholly within the channels along the edges thereof. Further, on the occasions that the circuit board or substrate may have a length longer than that of the channels, the inversion or flipping of the substrate can still be accomplished on one side of the feed plane without interference with anything located on the other side of the feed plan; and the orientation of the overall device during flipping is only limited to those which would prevent the oversized circuit board from falling out of a channel during such inversion.

Typically, the device is microprocessor controlled using a printed circuit board control module of Universal Instruments Corporation, part no. 43000401.

The following claims are intended to cover all of the generic and specific features of the invention herein described and all statements of the scope of the invention which, as a matter of language, might be said to fall therebetween.

Now that the invention has been described,
We Claim:

1. In a method of flipping a substrate edge over edge so as to accomplish reversing positions of first and second major surfaces thereof, said substrate having side edges and leading and trailing edges relative to a feed plane and a directed axis of feed within said feed plane, the improvement comprising the steps of:
   restraining said substrate by at least one of said substrate edges during feeding of said substrate along said feed axis and during said flipping;
   moving said substrate into either of one and another ends of a restraining means, selectively;
   raising and lowering said one end of said means for performing said restraining while displacing said another end of said restraining means along a path generally parallel to said feed axis in order to accomplish said flipping; and
   moving said substrate out of either of said one and another ends of said restraining means, selectively.

2. A method as in claim 1, and further comprising the steps of:
   presenting plural substrates serially to said substrate restraining means;
   selecting between flipping and not flipping each of said substrates; and
   flipping said substrates and passing said substrates through said restraining means without flipping, respectively, according to said selecting.

3. In an apparatus for flipping a substrate edge over edge so as to accomplish reversing positions of first and second major surfaces thereof, said substrate having side edges and leading and trailing edges relative to a feed plane and a directed axis of feed within said feed plane, the improvement comprising:
   means for restraining said substrate by at least one of said substrate edges during feeding of said substrate along said feed axis and during said flipping, said restraining means comprising means for receiving said substrate into either of one and another ends of said restraining means, selectively, and means for exiting said substrate from either of said one and another ends, selectively; and
   means for raising and lowering one end of said restraining means while displacing another end of said restraining means along a path generally parallel to said feed axis in order to accomplish said flipping.

4. The improvement as in claim 3, and further comprising:
   means for presenting plural substrates serially to said substrate restraining means;
   means for selecting between flipping and not flipping each of said substrates according to a program; and
   means for flipping said substrates and for passing said substrates through said restraining means without flipping, respectively, according to said selecting.

5. The improvement as in claim 3, and further comprising:
   said restraining means having individual means for receiving two opposite edges of said substrate; and
   means for adjusting a spacing between said edge receiving means according to a corresponding dimension of said substrate.

6. The improvement as in claim 3, wherein said restraining means further comprises:
   means for blocking said exiting of said substrate from said restraining means during said flipping.

7. In an apparatus for flipping a substrate edge over edge so as to accomplish reversing positions of first and second major surfaces thereof, said substrate having side edges and leading and trailing edges relative to a feed plane and a directed axis of feed within said feed plane, the improvement comprising:
   means for restraining said substrate by at least one of said substrate edges, said restraining means comprising at least one channel, generally U-shaped in cross-section with openings in opposite sides of the channel such that feed wheels can extend through said openings on either side of said channel and into frictional engagement with a substrate edge restrained therein in order to feed said substrate along said channel; and
   means for raising and lowering one end of said restraining means while displacing another end of said restraining means along a path generally parallel to said feed plane in order to accomplish said flipping.

8. The improvement as in claim 7, and further comprising:
   a follower at each end of said channel;
   a pivotal connection of generally a mid length point of said channel to a means for displacing said channel toward and away from said feed plane; and
   means for guiding at least one of said followers during said displacing so as to accomplish said flipping.

* * * * *